US010656210B2

(12) United States Patent
Takashima et al.

(10) Patent No.: US 10,656,210 B2
(45) Date of Patent: May 19, 2020

(54) SECONDARY BATTERY STATE DETECTION DEVICE AND SECONDARY BATTERY STATE DETECTION METHOD

(71) Applicants: FURUKAWA ELECTRIC CO., LTD., Tokyo (JP); Furukawa Automotive Systems Inc., Shiga (JP)

(72) Inventors: Naoya Takashima, Tokyo (JP); Noriyasu Iwane, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 83 days.

(21) Appl. No.: 15/613,108

(22) Filed: Jun. 2, 2017

(65) Prior Publication Data

US 2017/0269165 A1    Sep. 21, 2017

Related U.S. Application Data

(63) Continuation of application No. PCT/JP2015/084205, filed on Dec. 4, 2015.

(30) Foreign Application Priority Data

Dec. 5, 2014    (JP) ................................. 2014-247479

(51) Int. Cl.
*G01R 31/367*    (2019.01)
*G01R 31/388*    (2019.01)
(Continued)

(52) U.S. Cl.
CPC ........... *G01R 31/367* (2019.01); *G01R 31/36* (2013.01); *G01R 31/388* (2019.01);
(Continued)

(58) Field of Classification Search
None
See application file for complete search history.

(56) References Cited

U.S. PATENT DOCUMENTS 9,291,679 B2    3/2016    Yamada
2008/0136378 A1*  6/2008    Iwahana ............... G01R 31/367
                                                    320/153
(Continued)

FOREIGN PATENT DOCUMENTS

CN    101641607 A    2/2010
CN    102084261 A    6/2011
(Continued)

OTHER PUBLICATIONS

International Search Report for PCT Application No. PCT/JP2015/084205 dated Dec. 28, 2015, 4 pages.
(Continued)

*Primary Examiner* — Gregory J Toatley, Jr.
*Assistant Examiner* — Terence E Stifter, Jr.
(74) *Attorney, Agent, or Firm* — Amin, Turocy & Watson, LLP

(57)    ABSTRACT

Problem:
To accurately detect the state of charge of a secondary battery regardless of the state of the same.
Resolution Means:
A secondary battery state detection device 1 for detecting the state of a secondary battery 14 has a measurement unit (voltage sensor 11) for measuring or estimating the open-circuit voltage of the secondary battery, a determination unit (control unit 10) for determining a state of charge by applying the open-circuit voltage measured or estimated by the measurement unit to a correlation equation expressing the relationship between the open-circuit voltage and state of charge, a calculation unit (control unit 10) for calculating a state of charge on the basis of the internal resistance of the
(Continued)

secondary battery, and a correction unit (control unit 10) for correcting the correlation equation of the determination unit if the values of the state of charge determined by the determination unit and the state of charge calculated by the calculation unit differ.

15 Claims, 8 Drawing Sheets

(51) Int. Cl.
  *H01M 10/48* (2006.01)
  *G01R 31/36* (2020.01)
  *H02J 7/00* (2006.01)
  *G01R 31/389* (2019.01)

(52) U.S. Cl.
  CPC .......... *G01R 31/389* (2019.01); *H01M 10/48* (2013.01); *H02J 7/00* (2013.01)

(56) References Cited

U.S. PATENT DOCUMENTS

| | | | |
|---|---|---|---|
| 2010/0085057 A1 | 4/2010 | Nishi et al. | |
| 2011/0119005 A1 | 5/2011 | Majima et al. | |
| 2012/0290236 A1 | 11/2012 | Majima | |
| 2013/0138370 A1* | 5/2013 | Oh | G05B 11/01 702/63 |
| 2014/0347012 A1* | 11/2014 | Shim | G01R 31/3606 320/134 |
| 2015/0357852 A1* | 12/2015 | Nakao | G01R 31/3624 320/162 |
| 2016/0003912 A1 | 1/2016 | Iwane et al. | |
| 2016/0131720 A1* | 5/2016 | Baba | G01R 31/3651 702/63 |

FOREIGN PATENT DOCUMENTS

| | | |
|---|---|---|
| CN | 102762995 A | 10/2012 |
| DE | 102007037041 A1 | 2/2009 |
| EP | 1743184 B1 | 12/2011 |
| JP | H08-19103 A | 1/1996 |
| JP | 2005227164 A | 8/2005 |
| JP | 2009300362 A | 12/2009 |
| JP | 2013130504 A | 7/2013 |
| JP | 2014134391 A | 7/2014 |
| JP | 2014169937 A | 9/2014 |
| JP | 2014178213 A | 9/2014 |
| WO | 2013141100 A1 | 9/2013 |
| WO | 2014156265 A1 | 10/2014 |

OTHER PUBLICATIONS

Supplementary European Search Report for EP Application No. 15864877.4 dated Dec. 14, 2017, 7 pages.
Chinese Office Action for Chinese Application No. 201580059577.2 dated Feb. 28, 2019, 15 pages (with English translation).

* cited by examiner

SECONDARY BATTERY STATE DETECTION DEVICE AND SECONDARY BATTERY STATE DETECTION METHOD

CROSS-REFERENCE TO RELATED APPLICATIONS

The subject application is a continuation of, and claims priority to, PCT Application Serial No. PCT/JP2015/084205, filed Dec. 4, 2015, and entitled "SECONDARY BATTERY STATE DETECTION DEVICE AND SECONDARY BATTERY STATE DETECTION METHOD", which claims priority to Japanese Patent Application Serial No. 2014-247479, filed Dec. 5, 2014, which applications are hereby incorporated herein by reference in their respective entireties.

TECHNICAL FIELD

The present invention relates to a secondary battery state detecting device and a secondary battery state detecting method.

BACKGROUND ART

In Patent Document 1, the technology disclosed is a remaining capacity indicator of a lead-acid battery for an electronic motor vehicle that obtains a discharge rate at each measurement time point on the basis of an internal resistivity defined and calculated based on a measurement of an internal resistance executed in completing full charge and in a temporary stop while a vehicle is moving and corrects a calculated value of a remaining capacity by a current integration method, wherein the remaining capacity indicator is constituted of each unit of a measuring unit connected by a cable, a display circuit unit, and a display LED unit. The measuring unit has an analog circuit portion and a digital circuit portion. The analog circuit portion has an internal resistance detecting unit comprising a forced discharge circuit by a resistor and a differentiating circuit to detect a voltage drop and a current change in a forced discharge.

CITATION LIST

Patent Literature

Patent Literature 1: Japanese Unexamined Patent Application Publication No. H08-19103.

SUMMARY OF INVENTION

Technical Problem

In the technology disclosed in Patent Document 1, since a state of charge changes rapidly with a change in an internal resistivity in the range of a state of charge 100 to 30%, it is necessary to use mainly a current integration method in the range of the state of charge 100 to 30%. Therefore, there are any problems in an estimation in the range of the state of charge 100 to 30%.

A relation between an internal resistance and a discharge rate (a state of charge) or an aging deterioration capacity of a secondary battery varies depending on its stage of age deterioration from a new article state, and the change rates thereof differ depending on deterioration modes (hardening of a negative electrode active material, rot of a positive electrode grid, softening of a positive electrode active material, and the like). Moreover, in a case where, for example, a secondary battery that is not a new battery in an installation has deteriorated at that time, it is not possible to determine an aging deterioration amount until that time. Therefore, there is the problem that it is not possible to accurately estimate a remaining capacity.

In the technology disclosed in Patent document 1, a state of charge varies considerably depending on an internal state, an environmental condition, and the like of a secondary battery. For example, as for a liquid type lead-acid battery, during charging, concentrated sulfuric acid is accumulated at a lower part thereof due to specific gravity difference between water and sulfuric acid, and thus a concentration gradient of sulfuric acid is formed thereon (stratification). Therefore, a voltage between terminals and a charge acceptance change depending on a stratification degree thereof. Furthermore, a voltage between terminals also changes depending on state quantities of a capacity, a fluid volume, a weight, a volume, and so on of a secondary battery or an environmental temperature and so on around a secondary battery. During operation of a secondary battery, when one factor or multiple factors thereof are combined, a voltage between terminals is considerably affected thereby. Therefore, in the technology disclosed in Patent document 1, there is the problem that it is not possible to accurately detect a state of charge because it is not possible to accurately detect a charge state due to the effects of the foregoing variation factors. In addition, there is the problem that it is necessary to measure or estimate a voltage between terminals corresponding to a charge state of a secondary battery as accurately as possible, in order to accurately calculate a state of charge (SOC) of a secondary battery.

An object of the present invention is to provide a secondary battery state detecting device and a secondary battery state detecting method capable of accurately detecting a state of charge of a secondary battery regardless of the state of the same.

Solution to Problem

In order to solve the above problems, in the present invention, a secondary battery state detection device of detecting a state of a secondary battery comprises: a measurement unit of measuring or estimating an open-circuit voltage OCV (Open Circuit Voltage) of the secondary battery; a determination unit of determining a state of charge by applying the open-circuit voltage measured or estimated by the measurement to a correlation equation expressing the relationship between the open-circuit voltage and the state of charge; a calculation unit of calculating a state of charge on the basis of an internal resistance of the secondary battery; and a correction unit of correcting the correlation equation of the determination unit if the values of the state of charge determined by the determination unit and the state of charge calculated by the calculation unit differ.

In such a configuration, it is possible to accurately detect the state of charge of a secondary battery regardless of the state of the same.

In the present invention, the secondary battery state detection device further comprises: a learning unit of discharging the secondary battery and learning an element value of an equivalent circuit of the secondary battery on the basis of a voltage and an current in discharging; a measuring unit of charging the secondary battery and measuring a resistance value of the secondary battery on the basis of a voltage and a current in charging, wherein the calculating unit calculates the state of charge on the basis of a ratio of the element value learned by the learning unit to the internal resistance measured by the measuring unit.

In such a configuration, it is possible to accurately detect the state of charge of a secondary battery regardless of the state of the same, on the basis of the ratio of these resistance values.

In the present invention, the calculating unit calculates the state of charge by correcting a predetermined function including the ratio of the element value learned by the learning unit to the internal resistance measured by the measuring unit, on the basis of a temperature of the secondary battery.

In such a configuration, it is possible to accurately detect the state of charge of a secondary battery, even when a temperature thereof changes.

In the present invention, the measuring unit subtracts an open-circuit voltage, a stratification voltage, and a polarization voltage from the voltage in the charging, divides an overvoltage value obtained in the subtraction by the current value, and determines a value obtained in the division as the resistance value of the secondary battery.

In such a configuration, it is possible to calculate a state of charge in consideration of effects of stratification and polarization.

In the present invention, the correction unit executes a correction processing, in a case of an initial processing after the secondary battery is mounted in a vehicle, in a case where a charge current is less than one in a previous processing, or in a case where a period longer than a predetermined one has elapsed from the previous processing.

In such a configuration, it is possible to detect the accurate state of charge of a secondary battery, depending on the state of the same, by executing the correction processing in a proper timing.

In the present invention, a method of detecting a secondary battery state to detect a state of a secondary battery comprises the steps of: (a) measuring or estimating an open-circuit voltage of the secondary battery; (b) determining a state of charge by applying the open-circuit voltage to be measured or estimated in step (a) to a correlation equation expressing the relationship between the open-circuit voltage and the state of charge; (c) calculating a state of charge on the basis of an internal resistance of the secondary battery; (d) correcting the correlation equation in step (b) if the values of the state of charge determined in step (b) and the state of charge calculated in step (c) differ.

In such a method, it is possible to accurately detect the state of charge of a secondary battery regardless of the state of the same.

Advantageous Effects of Invention

According to the present invention, it is possible to provide a secondary battery state detecting device and a secondary battery state detecting method that are capable of accurately detecting the state of charge of a secondary battery regardless of the state of the same.

DESCRIPTION OF EMBODIMENTS

Embodiments of the present invention will be described below.

(A) Explanation of Configuration of Embodiments of the Present Invention

Figure 1:
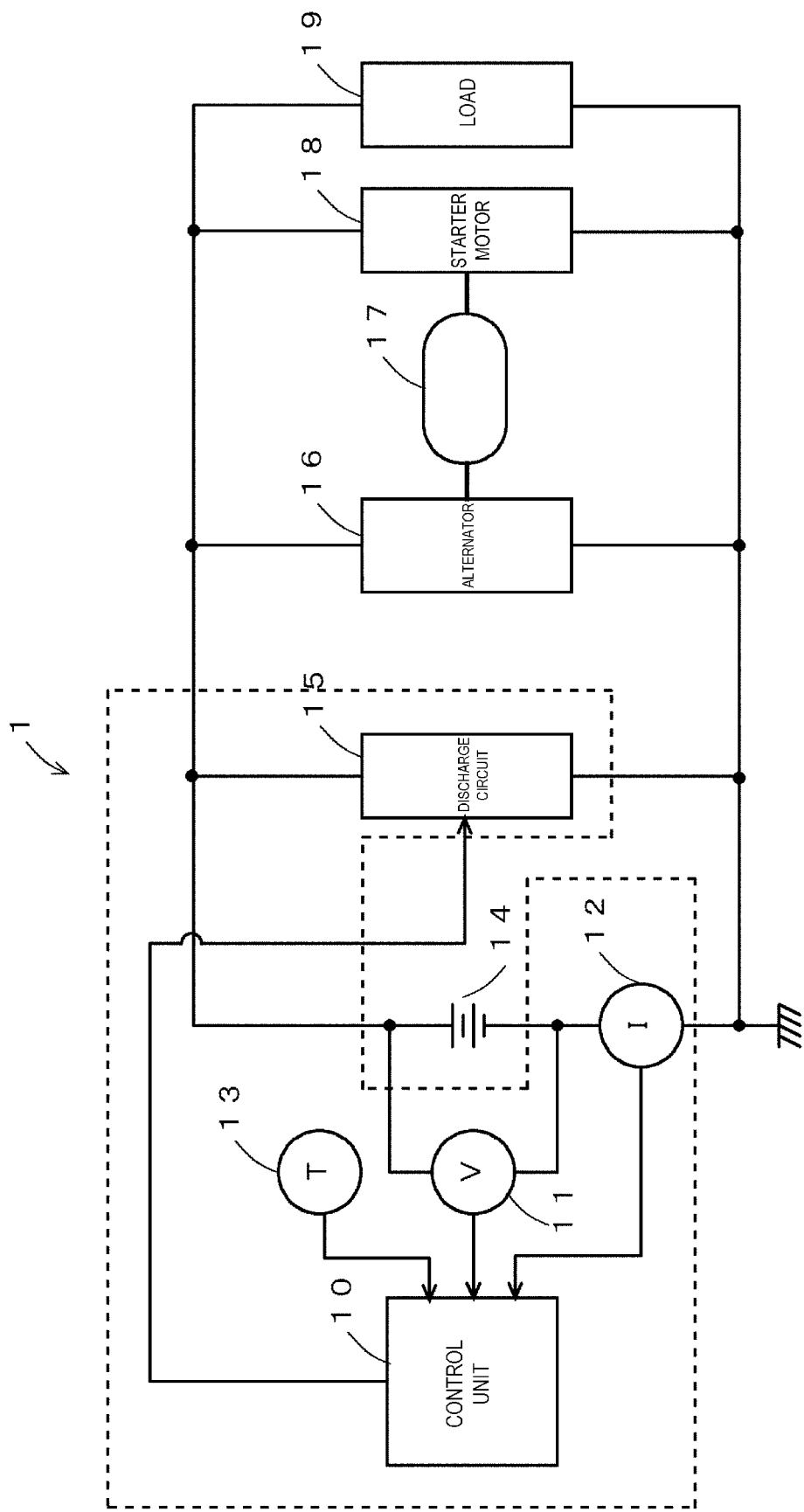
FIG. 1 is a view illustrating an example of a configuration of a secondary battery state detecting device according to an embodiment of the present invention.

FIG. 1 is a view illustrating a vehicle power supply system with a secondary battery state detecting device according to an embodiment of the present invention. In FIG. 1, the secondary battery state detecting device 1 includes the following primary components: a control unit 10, a voltage sensor 11, a current sensor 12, a temperature sensor 13, and a discharge circuit 15; and detects a state of a secondary battery 14. Here, the control unit 10 detects the state of the secondary battery 14 with reference to output from the voltage sensor 11, the current sensor 12, and the temperature sensor 13. The voltage sensor 11 detects a terminal voltage of the secondary battery 14 and sends the result to the control unit 10. The current sensor 12 detects the current flowing in the secondary battery 14 and sends the result to the control unit 10. The temperature sensor 13 detects the temperature of the secondary battery 14 itself or the ambient temperature therearound and sends the result to the control unit 10. The discharge circuit 15, which is constituted of, for example, a semiconductor switch, a resistance element, and the like connected in series, intermittently discharges the secondary battery 14 through on/off control of the semiconductor switch performed by the controller 10.

The secondary battery 14, which is constituted of, for example, a lead-acid battery, a nickel-cadmium battery, a nickel-metal hydride battery, a lithium-ion battery, or the like, is charged by an alternator 16. In addition, the secondary battery 14 drives a starter motor 18 to start an engine and supplies electric power to a load 19. The alternator 16 is driven by the engine 17, generates AC power, and converts the AC power into DC power by a rectifier circuit. The secondary battery 14 is then charged with the DC power.

The engine 17 is a reciprocating engine such as a petrol engine or a diesel engine, or a rotary engine, for example. The engine 17 is started by the starter motor 18 and drives drive wheels via a transmission to supply propulsive power to a vehicle. The engine 17 also drives the alternator 16 to generate electric power. The starter motor 18 is a DC motor, for example, and generates a rotational force using electric power supplied from the secondary battery 14 to start the engine 17. The load 19 is constituted of, for example, an electric power steering motor, a defogger, an ignition coil, a car audio system, a car navigation system and the like, and runs on electric power from the secondary battery 14.

Figure 2:
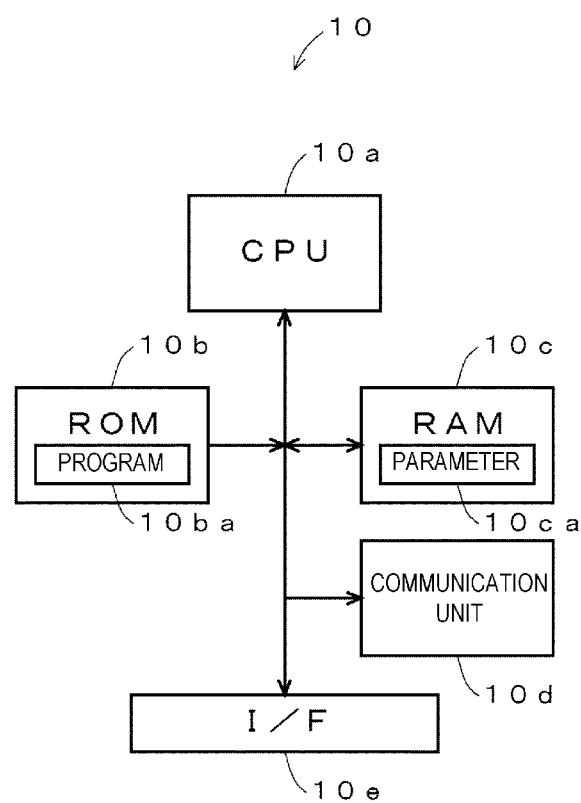
FIG. 2 is a block diagram illustrating an example of the detailed configuration of the control unit illustrated in FIG. 1.

FIG. 2 is a block diagram illustrating a detailed example of a configuration of the control unit 10 illustrated in FIG. 1. As illustrated in FIG. 2, the control unit 10 includes a central processing unit (CPU) 10a, a read-only memory (ROM) 10b, a random access memory (RAM) 10c, a communication unit 10d, and an interface (I/F) 10e. Here, the CPU 10a controls each component according to a program 10ba stored in the ROM 10b. The ROM 10b, which is, for example, a semiconductor memory and the like, stores the program 10ba and the like. The RAM 10c, which is, for example, a semiconductor memory and the like, stores parameters 10ca such as data generated when the program ba is executed and tables and mathematical expressions described later. The communication unit 10d performs communication with a higher-level device, namely, an electronic control unit (ECU) and the like, and reports detected information to the higher-level device. The I/F 10e converts signals sent from the voltage sensor 11, the current sensor 12, and the temperature sensor 13 into digital signals and imports the resulting signals, and furthermore supplies a driving current to the discharge circuit 15 to control the discharge circuit 15.

(B) Explanation of Operation of Embodiments

The operations of an embodiment of the present invention will be described with reference to the drawings. In an embodiment of the present invention, an ignition switch (not illustrated) to be operated to start the engine 17, is turned off, and then the engine 17 is stopped. When a certain time has elapsed, the control unit 10 controls the discharge circuit 15 to discharge the secondary battery 14 at a predetermined frequency and a predetermined current. Then, the voltage sensor 11 and the current sensor 12 respectively detect a voltage value and a current value in discharging. The control unit 10 executes a learning processing for parameters of an electrically equivalent circuit of the secondary battery 14, on the basis of the detected voltage value and the current value and the voltage value and the current value before discharging.

Figure 3:
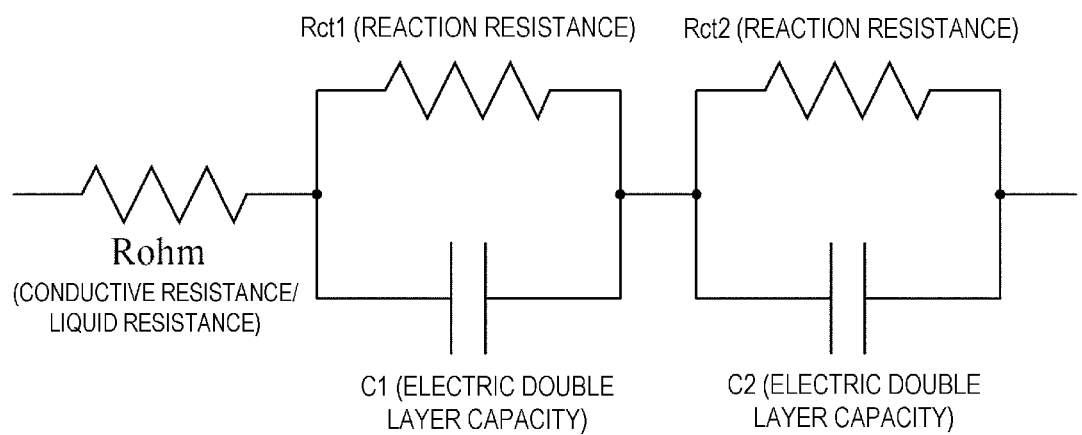
FIG. 3 is a diagram illustrating one example of an equivalent circuit of a secondary battery.

FIG. 3 is a diagram illustrating one example of an electrically equivalent circuit of the secondary battery 14. In this example, as for the equivalent circuit, Rohm (which is a conductive resistance and a liquid resistance) is serially-connected with a reaction resistance Rct1 and an electric double layer capacity C1 parallelly-connected with each other, and Rohm is also serially-connected with a reaction resistance Rct2 and an electric double layer capacity C2 parallelly-connected with each other. The CPU 10a of the control unit 10 performs the learning processing for parameters (element values) of such an equivalent circuit, using algorithms such as, for example, the Kalman filter or the support vector machine. The CPU 10a determines the parameter of the equivalent circuit obtained by the learning processing as the parameter 10ca, and stores the parameter 10ca in the RAM 10c.

The equivalent circuit illustrated in FIG. 3 is merely one example. In other examples there may be one reaction resistance and one electric double layer capacity to be parallelly-connected with each other, or there may be three or more reaction resistances and three or more electric double layer capacities to be parallelly-connected with each other. Alternatively, the electric double layer capacity may be constituted of only resistances without an electric double layer capacity.

When the ignition switch is turned on, the engine 17 starts, and a vehicle enters an operating state. At that time, in the CPU 10a of the control unit 10, the voltage sensor 11 and the current sensor 12 respectively measures a voltage value V and a current value I of the secondary battery 14 at a predetermined period. The CPU 10a determines these measured values as the parameter 10ca, and stores the parameter 10ca in the RAM 10c.

The CPU 10a obtains state quantities caused by variation of the secondary battery 14 at a predetermined period, and stores them in the RAM 10c as the parameter 10ca. Here, state quantities caused by variation refer to state quantities of factors (causes) in which the secondary battery 14 deviates (varies) from a reference state. As a specific example, it is considered to be, for example, a temperature T. Other than this, it is possible to use a stratification St, a polarization Pl, a deterioration state Dt, a battery capacity Cp, and a battery size Sz as state quantities caused by variation. Note that the stratification St refers to a state of layer formed based on an ion concentration of an electrolytic solution of the secondary battery 14. The polarization Pl refers to a state in which an electrode potential deviates from a resting potential due to charge and discharge. The deterioration state Dt refers to a deterioration state (for example, SOH (State of Health)) of the secondary battery 14. The battery capacity Cp refers to a chargeable and dischargeable capacity of the secondary battery 14 at the time. The battery size Sz refers to a chargeable and dischargeable capacity of the secondary battery 14 at an incipient period. In addition, the battery size Sz is a constant value regardless of time passage, on the other hand, St, Pl, Dt, and Cp changes depending on time passage. In the following explanations, as state quantities caused by variation, the temperature T, the stratification St, and the polarization Pl are explained as examples, alternatively the deterioration state Dt, the battery capacity Cp, and the battery size Sz may also be used.

When the ignition switch is turned off, the engine 17 stops. At that time, The CPU 10a obtains a voltage value V and a current value I of the secondary battery 14 measured immediately before stopping, and obtains the temperature T, the stratification St, and the polarization Pl, that is, state quantities caused by variation obtained immediately before stopping, from the RAM 10c.

The CPU 10a determines whether a condition is satisfied or not in which a correction processing for a correlation equation (hereinafter, referred to as "OCV-SOC correlation equation") is executed. In particular, for example, in a case of an initial processing after the secondary battery 14 is mounted in a vehicle, the CPU 10a determines that the condition is satisfied. Note that, when comparing a current value I obtained when the engine 17 is stopped this time with a current value I obtained when the engine 17 is stopped the previous time, if the current value I obtained in the stopping at this time is less than the current value I obtained in the stopping at the previous time, or if a predetermined period (one month) has elapsed from the previous correction processing, the CPU 10a determines that the condition is satisfied. If the CPU 10a determines that the condition is satisfied, it executes the correction processing for OCV-SOC correlation equation.

In the correction processing of OCV-SOC correlation equation, the CPU 10a calculates an overvoltage value ΔV, by applying, to the following Equation (1), an average charge voltage calculated by an averaging processing until a period immediately before stopping of the engine 17, an open-circuit voltage OCV calculated on the basis of SOC (in this case, SOC to be calculated in a charge and discharge integration) of OCV-SOC correlation equation in which an initial learning was performed or a learning at previous time was performed, and the stratification St and the polarization Pl, that is, state quantities caused by variation, to be obtained immediately before stopping. In addition, an internal resistance R is calculated, by applying, to Equation (2), ΔV and an average current value I calculated by an averaging processing until a period immediately before stopping of the engine 17. Here, it can be considered that the internal resistance R is constituted of the Rohm (a liquid resistance, a conductor resistance), Rct1 (a negative reaction resistance), and a Rct2 (a positive reaction resistance) as illustrated in FIG. 3. After the internal resistance R is calculated, the CPU 10a calculates a state of charge (SOC) on the basis of Equation (3). In Equation (3), since effects caused by a temperature is considered, it is possible to, for example, multiply an amplitude coefficient f (T), in which a temperature is regarded as a variable, and add a offset value f'(T). It is possible to perform a correction depending on temperature on the basis of the amplitude coefficient f (T) and the offset value f'(T). Additionally, exp(R, Rohm, Rct1, Rct2) is an exponential function, in which R, Rohm, Rct1, Rct2 are regarded as variables. Each of attenuation coefficients in the brackets can be regarded as an internal resistance ratio that is represented as, for example, a ratio of a reaction resistance component obtained by subtracting Rohm (a conductive resistance and a liquid resistance) from the internal resistance R to a sum value of Rct1 and Rct2 preliminarily obtained. Note that, since the values of Rohm, Rct1, Rct2, the stratification St, and the polarization Pl change depending on temperature effects, it is desirable that a correction is performed on the basis of the detected temperature T. Moreover, Equation (3) is represented as a linear exponential function. On the other hand, Equation (3) may be represented as a high order exponential function or a logarithmic function.

$$\Delta V = \text{Charge Voltage} - \text{Open circuit voltage} - St - Pl \qquad (1)$$

$$R = \Delta V / I \qquad (2)$$

$$SOC = f(T) \times \exp(R, Rohm, Rct1, Rct2) + f'(T) \qquad (3)$$

Figure 4:
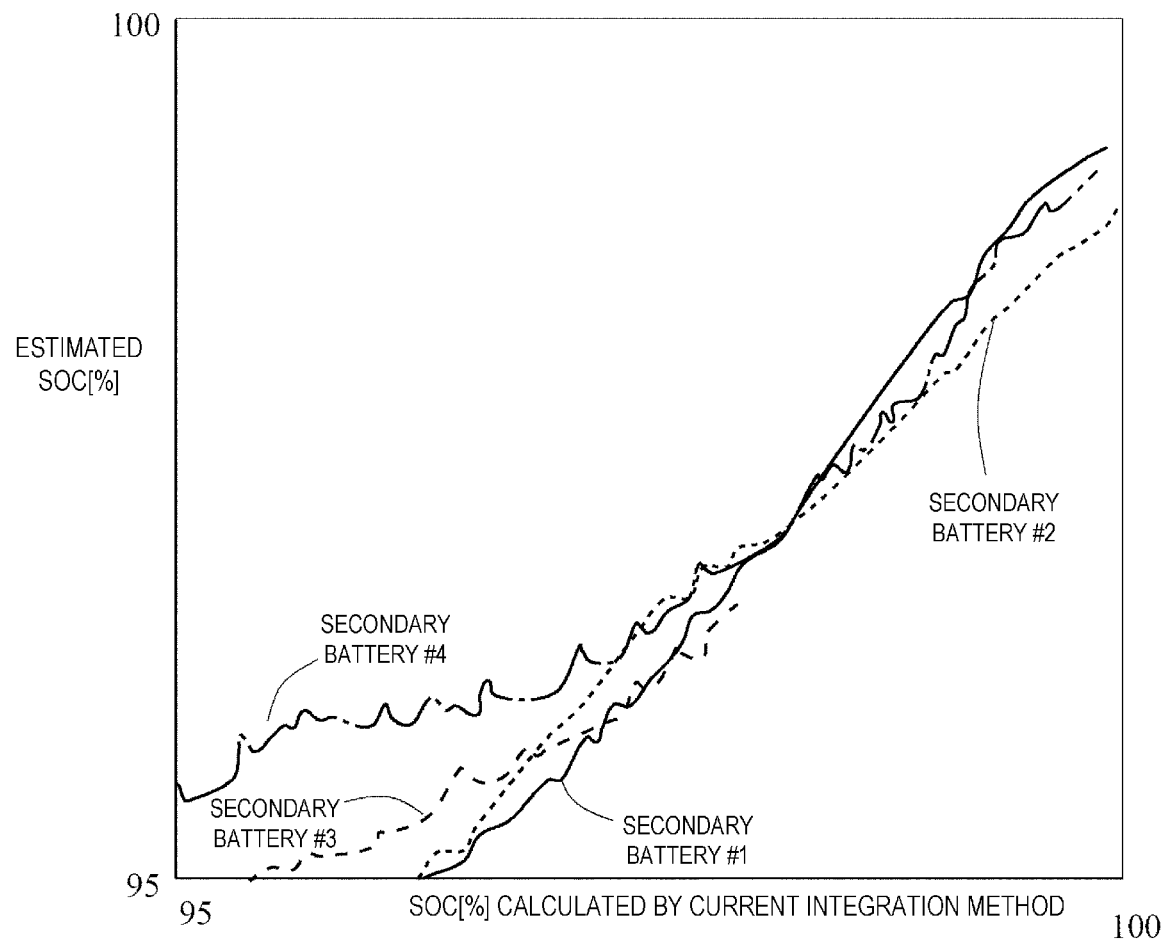
FIG. 4 is a chart comparing SOC obtained by Equation (3) with SOC obtained by an actual measurement.

FIG. 4 is a chart illustrating a correspondence relation of SOC calculated by a current integration method to SOC obtained by Equation (3), as for four types of secondary batteries #1 to #4. In FIG. 4, a horizontal axis illustrates SOC calculated by a current integration method, and a vertical axis illustrates SOC obtained by Equation (3). Also, a solid line illustrates an actual measurement result of the secondary battery #1 (a secondary battery (Q-85) for a vehicle, having a function in which an idling is stopped when a vehicle stops, that is, "an idling stop function"). A broken line at short intervals illustrates an actual measurement result of the secondary battery #2 (a normal secondary battery (55D23)). A broken line at long intervals illustrates an actual measurement result of the secondary battery #3 (a normal secondary battery (38B19)). A chain line illustrates an actual measurement result of the secondary battery #4 (a secondary battery (M-42) for a vehicle having an idling stop function). As for an actual measurement method, these secondary batteries #1 to #4 are mounted in vehicles, charge of the each secondary battery starts at SOC=90%, the vehicles are driven on a public road, and the charge stops at the SOC=100%. After that, a SOC of the each secondary battery is measured. FIG. 4 illustrates behaviors of the each second battery at SOC=95 to 100%. In FIG. 4, if a horizontal axis is "x" and a vertical axis is "y", when a measurement result on a linear function y=x is positioned, there is an ideal relation without an error between SOC obtained by Equation (3) and SOC calculated by a current integration method. It is understood that these four types of measurement results are positioned at positions close to the linear function y=x, and therefore SOC similar to that of the current integration method SOC can be estimated by Equation (3).

The CPU 10a calculates an open circuit voltage OCV of the secondary battery 14. In particular, the CPU 10a measures a voltage Va of the secondary battery 14 when a certain time has elapsed from stopping of the engine 17, or CPU 10a estimates a voltage Vb after a certain time has elapsed from a voltage change in the secondary battery 14 after stopping of the engine 17. The CPU 10a determines Va or Vb as OCV.

The CPU 10a calculates SOC(i) by applying OCV to OCV-SOC correlation equation, and compares the calculated SOC(i) with SOC(ii) calculated by the foregoing Equations (1) to (3). The CPU 10a determines that OCV-SOC correlation equation is correct if SOC(i) corresponds to SOC (b), otherwise, the CPU 10a corrects OCV-SOC correlation equation. Note that, as for a correction method, for example, OCV-SOC correlation equation is represented as a linear function (for example, SOC=a*OCV+b). By correcting a value of the intercept b of this linear function, the correction is performed so that SOC(i) obtained by applying OCV to OCV-SOC correlation equation corresponds to SOC(ii) obtained by Equations (1) to (3). Note that, since a,b have a temperature dependence, it is desirable that the a,b is corrected on the basis of a temperature.

As the above descriptions, after OCV-SOC correlation equation is corrected, it is possible to accurately calculate SOC based on OCV on the basis of OCV-SOC correlation equation after correction.

As described above, in an embodiment of the present invention, a state of charge (SOC) is calculated by Equation (3) on the basis of the internal resistance ratio calculated based on the internal resistance R calculated by Equations (1) and (2) and the resistance element constituting the equivalent circuit illustrated in FIG. 3 calculated by the learning processing. OCV-SOC correlation equation is corrected on the basis of the state of charge (SOC). Therefore, it is possible to accurately calculate a state of charge (SOC) of the secondary battery 14, regardless of the state of the same.

(C) Explanation of Operation of Embodiments

Figure 5:
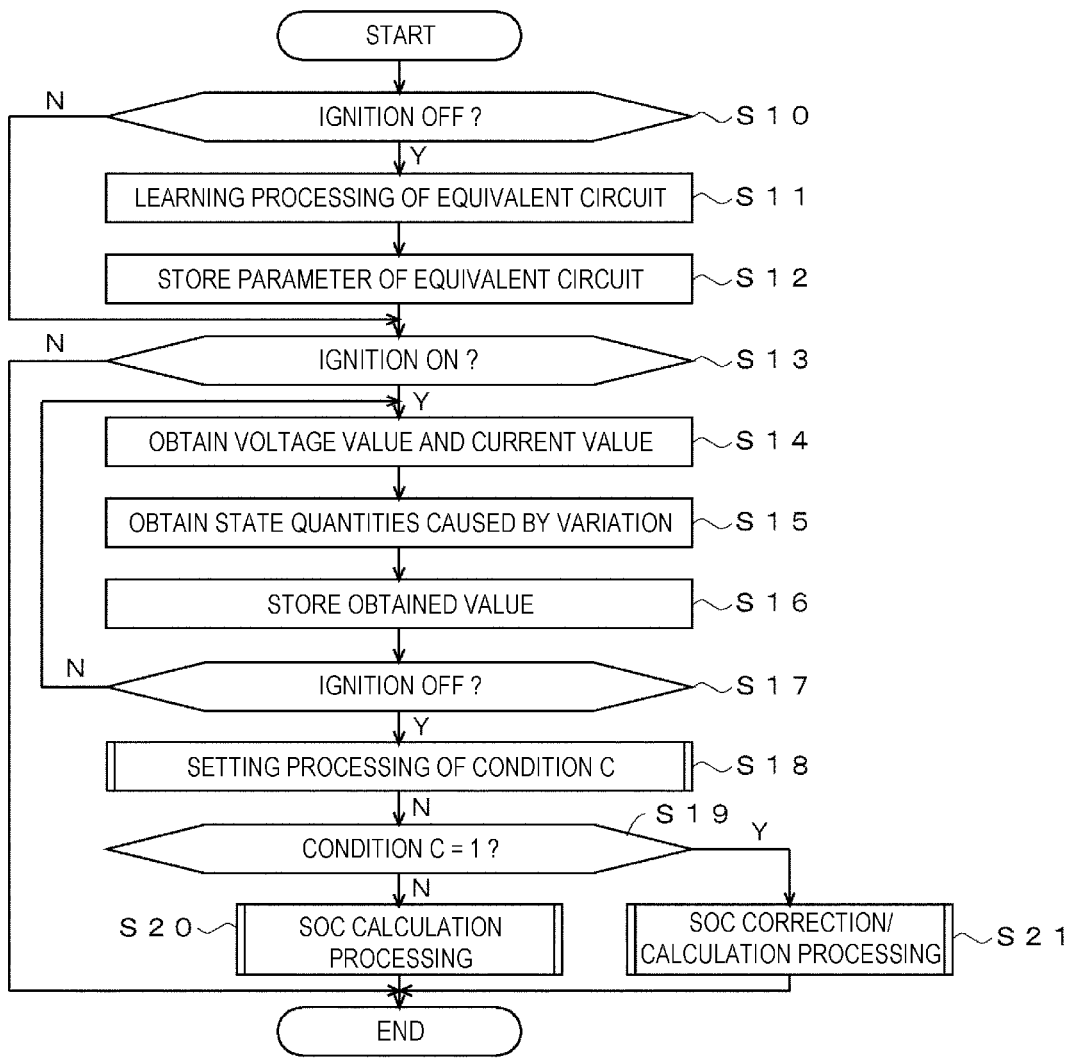
FIG. 5 is a flowchart depicting one example of a processing that is executed in the embodiment illustrated in FIG. 1.

With reference to FIGS. 5 to 8, one example of the detailed processing executed in an embodiment of the present invention will be described. FIG. 5 is a flowchart depicting one example of a main processing that is executed in an embodiment of the present invention. Once the processing of the flowchart depicted in FIG. 5 starts, the following steps are executed.

In step S10, the CPU 10a determines whether the ignition switch (not illustrated) is turned off or not. If it is determined that the ignition switch is turned off (step S10:Yes), the process proceeds to step S11, otherwise (step S10:No), the process proceeds to step S13. For example, the CPU 10a determines as "Yes" if the ignition switch is turned off by a driver, and then the process proceeds to step S11.

In step S11, the CPU 10a executes a learning processing for each parameter (element value) constituting the equivalent circuit of the secondary battery 14 illustrated in FIG. 3. In particular, the CPU 10a controls the discharge circuit 15 to discharge the secondary battery 14 at a predetermined frequency and a predetermined current value. Then, a voltage value and a current value at that time are respectively obtained from the voltage sensor 11 and the current sensor 12. The CPU 10a executes a learning processing for parameters of an electrically equivalent circuit of the secondary battery 14, on the basis of a voltage value and a current value before discharging. Note that in the learning processing, it is possible to use algorithms such as, for example, the Kalman filter or the support vector machine.

In step S12, the CPU 10a determines the parameter of the equivalent circuit obtained by the learning processing of step S11 as the parameter 10ca, and stores the parameter 10ca in the RAM 10c.

In step S13, the CPU 10a determines whether the ignition switch (not illustrated) is turned on or not. If it is determined that the ignition switch is turned on (step S13:Yes), the process proceeds to step S14, otherwise (step S13:No), the processing terminates. For example, the CPU 10a determines as "Yes" if the ignition switch is turned on by a driver, and then the process proceeds to step S14.

In step S14, the CPU 10a obtains a voltage value and a current value of the secondary battery 14 at that time from the voltage sensor 11 and the current sensor 12.

In step S15, the CPU 10a obtains state quantities caused by variation. In particular, the CPU 10a obtains the temperature T, the stratification St, and the polarization Pl, the deterioration state Dt, the battery capacity Cp, and the battery size Sz, as the state quantities caused by variation. Here, the temperature T is obtained from the temperature sensor 13. Note that, since the battery size Sz is a fixed value, a preliminarily stored value is obtained from, for example, the RAM 10c. The stratification St, and the polarization Pl, the deterioration state Dt, and the battery capacity Cp can be calculated with reference to, for example, an integration value of a current flowing in the secondary battery 14 or an internal resistance in charge and discharge. In addition, the deterioration state Dt of the secondary battery 14 can be calculated on the basis of a temporal change of a conductive resistance and a liquid resistance, a reaction resistance, and an electric double layer capacity. Moreover, the deterioration state Dt, the battery capacity Cp, and the battery size Sz are not used in Equations (1) to (3), however, these values may be included in Equations (1) to (3).

In step S16, the CPU 10a determines a voltage value and a current value obtained in step S14 and the state quantities caused by variation obtained in step S15 as the parameter 10ca, and stores the parameter 10ca in the RAM 10c.

In step S17, the CPU 10a determines whether the ignition switch (not illustrated) is turned off or not. If it is determined that the ignition switch is turned off (step S17:Yes), the process proceeds to step S18, otherwise (step S17:No), the process returns to step S14, and then repeats the same processing. For example, the CPU 10a determines as "Yes" if the ignition switch is turned off by a driver, and then the process proceeds to step S18.

In step S18, the CPU 10a executes a processing that sets (calculates) a condition C in which it is determined whether the correction processing of SOC is executed or not. In the condition C, if the correction processing is necessary, the condition is set to C=1, otherwise, the condition is set to C=0. Note that the detailed setting processing of the condition C is described later with reference to FIG. 6.

In step S19, the CPU 10a determines whether the condition calculated in Step S18 is C=1 or not. If the condition is C=1 (step S19:Yes), the process proceeds to step S21, otherwise (step S19:No), the process proceeds to step S20. For example, if the condition is C=1, the CPU 10a determines as "Yes", and then the process proceeds to Step S21.

In step S20, the CPU 10a executes a calculation processing of SOC from OCV on the basis of OCV-SOC correlation equation. Note that the detailed processing is described later with reference to FIG. 7.

In step S21, the CPU 10a corrects OCV-SOC correlation equation and executes the calculation processing of SOC. Note that the detailed processing is described later with reference to FIG. 8.

The details of "setting processing of condition C" depicted in step S18 of FIG. 5 are described with reference to FIG. 6. Once the processing of the flowchart depicted in FIG. 5 starts, the following steps are executed.

In step S30, the CPU 10a assigns "0" as a default value to a variable C.

In step S31, the CPU 10a determines whether it is the initial processing or not. If the processing is the initial processing (step S31:Yes), the process proceeds to step S32, otherwise (step S31:No), the process proceeds to step S33. In particular, with the secondary battery 14 mounted in a vehicle, if the correction processing has not yet been executed, the CPU 10a determines as "Yes", and then the process proceeds to Step S32.

In step S32, the CPU 10a assigns "1" to the variable C. Thereby, in Step S19 of the FIG. 5, the process is determined as "Yes".

In step S33, the CPU 10a determines whether an average current value is a positive number or not, and determines whether an average current value is less than one at previous time or not. If the average current value is less than one at previous time (step S33:Yes), the process proceeds to step S34, otherwise (step S33:No), the process proceeds to step S35. In particular, if the average current value measured immediately before the stopping of the engine 17 in the processing of Step S14 is less than a measurement value at previous time, the CPU 10a determines as "Yes", and then the process proceeds to step S34. Here, it means that the average current value is small, that is, SOC is large. As SOC becomes greater, it is possible to more accurately correct OCV-SOC correlation equation. Therefore, if the average current value in the processing of Step S14 is less than that at previous time, it is possible to make OCV-SOC correlation equation more accurate.

In step S34, the CPU 10a assigns "1" to the variable C.

In step S35, the CPU 10a determines whether a period longer than a predetermined one has elapsed from the time when the previous correction processing was executed, or not. If it is determined that a period longer than a predetermined one has elapsed from the previous time (step S35: Yes), the process proceeds to step S36, otherwise (step S35:No), the process backs (returns) to the processing in FIG. 5. For example, the CPU 10a determines as "Yes" if a period has elapsed over one month from the time when the previous correction processing was executed, and then the process proceeds to step S36. That is, the correction of OCV-SOC correlation equation is not executed if a state has continued in which the average current value is greater than the previous value. Therefore, for example, if a predetermined period (for example, one month) has elapsed from the time when the previous correction processing was executed, the CPU 10a executes the correction processing, and thus it is possible to correct OCV-SOC correlation equation depending on a temporal change.

In step S36, the CPU 10a assigns "1" to the variable C. Then, the process backs (returns) to the processing in FIG. 5.

In the above processing, if the condition is satisfied in which the correction processing is executed, the condition is set to C=1, otherwise, the condition can be set to C=0.

Figure 7:
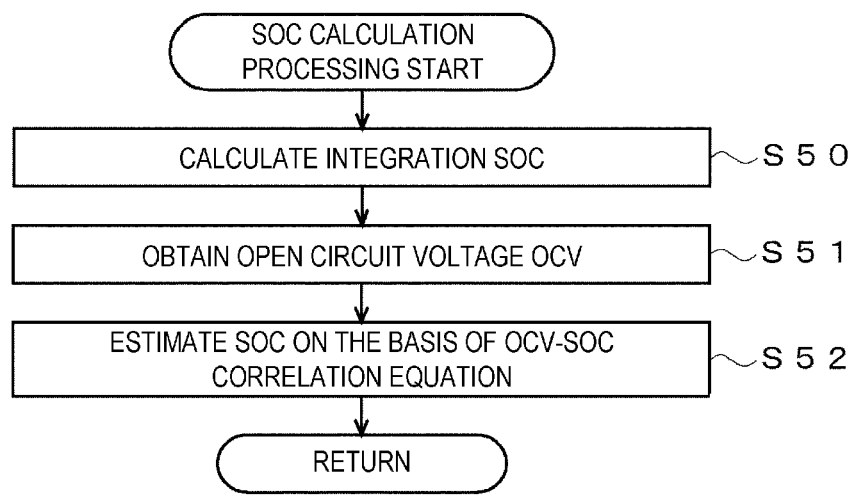
FIG. 7 is a flowchart depicting one example of a detailed processing of "SOC calculation processing" of step S20 in FIG. 5.

With reference to FIG. 7, details of the SOC calculation processing of step S20 depicted in FIG. 5 are described. Once the processing depicted in FIG. 7 starts, the following steps are executed.

In step S50, the CPU 10a calculates an integration SOC. In particular, on the basis of the SOC at a certain time, the CPU 10a integrates a current flowing in and out of the secondary battery 14, and thus obtains the integration SOC.

In step S51, the CPU 10a obtains the open circuit voltage OCV. Note that, in the method of calculating the open circuit voltage OCV, for example, if a predetermined period (for example, a few hours) has elapsed from the time when a vehicle stops, and if the average current flowing in the load 19 is less than a predetermined threshold value, the CPU 10a measures a voltage of the secondary battery 14, and thus can obtain the open circuit voltage OCV. Alternatively, on basis of a temporal change of a voltage of the secondary battery 14, the open circuit voltage that is a stable voltage may be estimated.

In step S52, the CPU 10a applies, to OCV-SOC correlation equation in which the correction processing is implemented in Step S21 of FIG. 5 as needed, the open circuit voltage OCV calculated in Step S51, and calculates the state of charge SOC.

In the above processing, the CPU 10a calculates the integration SOC, and can calculate SOC, using OCV-SOC correlation equation in which the correction processing is implemented in Step S21 of FIG. 5 as needed, and can obtain the high precision SOC.

Figure 8:
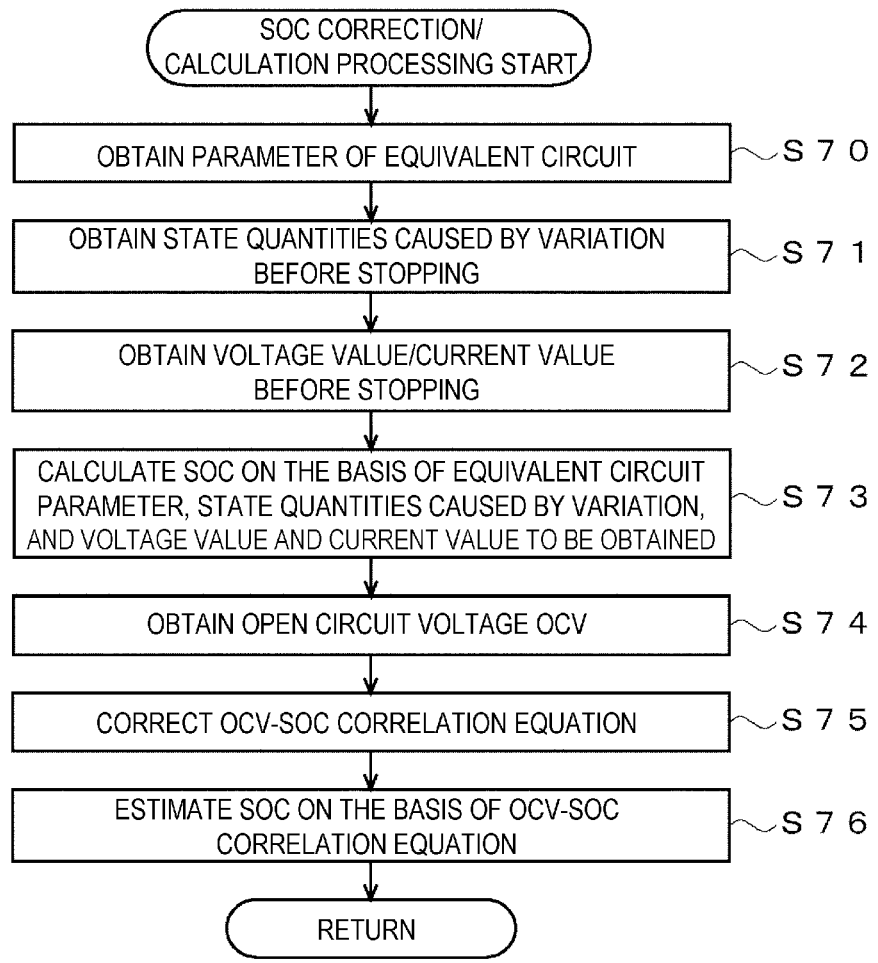
FIG. 8 is a flowchart depicting one example of a detailed processing of "SOC correction/calculation processing" of step S21 in FIG. 5.

With reference to FIG. 8, details of the correction and calculation processing of step S21 depicted in FIG. 5 are described. Once the processing depicted in FIG. 8 starts, the following steps are executed.

In Step S70, the CPU 10a obtains the parameter of the equivalent circuit stored in Step S12 of FIG. 5, from the RAM 10c.

In Step S71, the CPU 10a obtains the parameter stored before stopping of the engine 17 (for example, immediately before stopping of the engine 17), of state quantities caused by variation stored in Step S15 of FIG. 5, from the RAM 10c. Note that state quantities caused by variation stored before stopping of the engine 17 are obtained, because the updated state quantities caused by variation are used. As a matter of course, as for state quantities caused by variation having few changes over time, instead of information immediately before stopping, information further before immediately before the stopping may be used.

In Step S72, the CPU 10a obtains the parameter stored before stopping of the engine 17 (for example, immediately before stopping of the engine 17), of the voltage value and the current value stored in Step S14 of FIG. 5, from the RAM 10c. Note that the voltage value and the current value stored before stopping of the engine 17 are obtained, because the updated voltage value and current value are used.

In Step S73, the CPU 10a applies the obtained equivalent circuit parameter, the state quantities caused by variation, and the voltage value and the current value, to the foregoing Equations (1) to (3), and thus calculates a SOC value of the secondary battery 14 at that time. Note that Equations (1) to (3) are mere examples, and equations other than Equations (1) to (3) may be used. Alternatively, instead of equations, for example, a table may be used.

In step S74, the CPU 10a obtains the open circuit voltage OCV. Note that in the method of calculating the open circuit voltage OCV, for example, similar to the foregoing case, if a predetermined period (for example, a few hours) has elapsed from the time when a vehicle stops, and if the current flowing in the load 19 is less than a predetermined threshold value, the CPU 10a measures a voltage of the secondary battery 14, and thus can obtain the open circuit voltage OCV. Alternatively, on basis of a temporal change of a voltage of the secondary battery 14, the open circuit voltage that is a stable voltage may be estimated.

In step S75, the CPU 10a executes the correction processing of OCV-SOC correlation equation. In particular, the CPU 10a calculates SOC(i) by applying OCV obtained in step S74 to OCV-SOC correlation equation, and compares the calculated SOC(i) with SOC(ii) calculated by the foregoing Equations (1) to (3). The CPU 10a determines that it is unnecessary to perform a correction because OCV-SOC correlation equation is correct if SOC(i) corresponds to SOC(ii), otherwise, the CPU 10a corrects OCV-SOC correlation equation. Note that, as for a correction method, for example, OCV-SOC correlation equation is represented as a linear function (for example, SOC=a*OCV+b). By correcting a value of the intercept b of this linear function, the correction is performed so that SOC(i) obtained by applying OCV to OCV-SOC correlation equation corresponds to SOC(ii) obtained by Equations (1) to (3). Note that the slope a may be corrected with the above correction. In that case, by performing calculations on the basis of a plurality of SOC, both the a and the b can be corrected.

In step S76, the CPU 10a applies the open circuit voltage OCV calculated in Step S74 to OCV-SOC correlation equation, and thus calculates the state of charge SOC. Then, the process backs (returns) to the processing in FIG. 5.

In the above processing, the CPU 10a applies the equivalent circuit parameter, the state quantities caused by variation before stopping of the engine 17, and the voltage value and the current value before the stopping, to Equations (1) to (3), and thus calculates the state of charge SOC. Comparing SOC(ii) calculated by Equations (1) to (3) with SOC(i) calculated by OCV-SOC correlation equation, if the SOC(i) does not correspond to SOC(ii), it is possible to correct OCV-SOC correlation equation.

As described above, in an embodiment of the present invention, SOC is calculated on the basis of the foregoing Equations (1) to (3) and OCV-SOC correlation equation is corrected on the basis of the calculated SOC. Therefore, if the secondary battery 14 is not in a full charge state, it is possible to accurately calculate SOC. In this way, it does not wait until the secondary battery 14 becomes a full charge state, and thus it is possible to reduce a unnecessary charge and improve a fuel cost.

In the present embodiment, SOC is calculated on the basis of the internal resistance ratio and the state quantities caused by variation and OCV-SOC correlation equation is corrected on the basis of the calculated SOC. Therefore, it is possible to calculate SOC of the secondary battery 14 with high accuracy regardless of the state or the use related information of the same. Also, the deterioration state of the secondary battery 14 and factors that are different depending on types of the secondary battery 14 are obtained as state quantities caused by variation. By calculating SOC on the basis of this obtained state quantities caused by variation, even if the secondary battery 14 is replaced (if it is replaced to the same type of the secondary battery 14, and if it is replaced to the different type of the secondary battery 14), it is possible to calculate SOC of the same with high accuracy.

(C) Explanation of Alternate Embodiments

It is needless to say that the embodiment described above is merely one example and the present invention is not limited to the cases as described above. For example, in the embodiment described above, the correction is performed by using f(T) and f'(T) in equation (3). On the other hand, either one f(T) or f'(T) may be used, or both f(T) and f'(T) may be used.

In the embodiment described above, in the correction processing, if SOC(ii) calculated by Equation (3) does not correspond to SOC(i) calculated by OCV-SOC correlation equation, a correction is performed. For example, if the difference value is less than a predetermined threshold value, the correction may be executed.

In the embodiment described above, a temperature, a stratification, a polarization, a deterioration state, a battery capacity, and a battery size are used as the state quantities caused by variation. However, all these values may not be used, and a part of these values may be used. Also, it is experimentally proved that it has large effects in the order of the temperature, the stratification, the polarization. Therefore, these values may be preferentially used, or coefficients depending on small and large of the effects may be used.

In the embodiment described above, the foregoing Equations (1) to (3) are mere one example, and equations other than Equations (1) to (3) may be used. Alternatively, instead of equations, a table may be used.

In the embodiment described above, values immediately before stopping the engine 17 are used as state quantities caused by variation, and a voltage value and a current value. On the other hand, instead of the values immediately before the stopping, values at a few minutes to tens of minutes before the stopping may be used. Also, an obtaining timing may be changed depending on an operating time. For example, in a case of an operation for a long time, for example, since a temperature is stabilized when the engine 17 operates to some extent, it is possible to obtain a value after the temperature is stabilized. On the other hand, in a case of an operation for a short time, since the engine 17 stops before the temperature is stabilized, it is desirable to obtain a value immediately before the stopping. Furthermore, the obtaining timing may be set depending on type of state quantities caused by variation. For example, a voltage value and a current value with drastic changes are obtained immediately before the stopping and a deterioration state moderately changes, and therefore it can be obtained on a regular basis (for example, per one week). Note that values obtained at one time measurement are not used, and average values of values obtained at a plurality of measurements may be calculated.

In the embodiment described above, the equivalent circuit illustrated in FIG. 3 is used as the equivalent circuit of the secondary battery 14. Alternatively, an equivalent circuit other than this equivalent circuit may be used. For example, a number of each of the reaction resistance and the electric double layer capacity parallelly-connected with each other may be one, or three or more. Alternatively, an equivalent circuit constituted of only a resistance without an electric double layer capacity may be used.

In the embodiment described above, the foregoing linear expression is used as OCV-SOC correlation equation. Alternatively, an equation other than the linear expression may be used, or instead of an equation, a table may be used.

Figure 6:
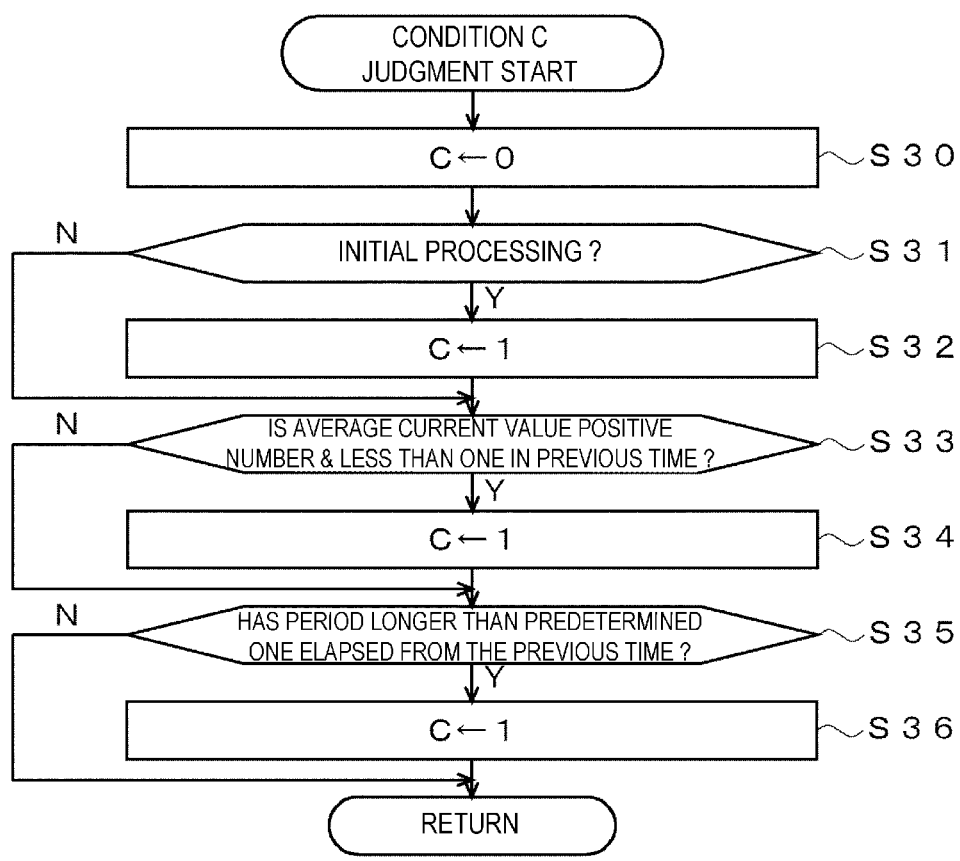
FIG. 6 is a flowchart depicting one example of a detailed processing of "setting processing of condition C" of step S18 in FIG. 5.

As depicted in Step S33 of FIG. 6, comparing a current value at previous time with one at this time, the determination is performed, however, if a current value at this time is less than a predetermined threshold value, the condition may be set to C=1. Note that, for example, 10 A can be used as the threshold value.

REFERENCE SIGNS LIST

1 Secondary battery state detecting device
10 Control unit (determination unit, calculating unit, correction unit, learning unit, measuring unit)
10a CPU
10b ROM
10c RAM
10d Communication unit
10e I/F
11 Voltage sensor (measurement unit)
12 Current sensor
13 Temperature sensor
14 Secondary battery
15 Discharge circuit
16 Alternator
17 Engine
18 Starter motor
19 Load

The invention claimed is:

1. A secondary battery state detection device that detects a state of charge of a secondary battery installed in a vehicle, the secondary battery state detection device comprising:
   a memory that stores computer executable units; and
   a processor that executes the computer executable units stored in the memory, wherein the computer executable units comprise:
      a measurement unit that measures or estimates an open-circuit voltage of the secondary battery installed in the vehicle;
      a determination unit that determines a first state of charge by applying the open-circuit voltage measured or estimated by the measurement unit to a correlation equation expressing a relationship between open-circuit voltages and states of charge;
      a learning unit that discharges the secondary battery and learns an element value of an equivalent circuit of the secondary battery based on a voltage and a current obtained during the discharging;
      the measurement unit charges the secondary battery, and measures an internal resistance value of the secondary battery based on another voltage and another current during the charging;
      a calculation unit that calculates a second state of charge based on a ratio of a reaction resistance obtained by subtracting a conductive resistance and a liquid resistance from the internal resistance and a sum of reaction resistance values obtained by the learning unit; and
      a correction unit that corrects a coefficient of the correlation equation of the determination unit to generate a modified correlation equation if a difference between the values of the first state of charge determined by the determination unit and the second state of charge calculated by the calculation unit is greater than or equal to a predetermined threshold value, wherein
      the determination unit determines a corrected state of charge of the secondary battery based on the modified correlation equation.

2. The secondary battery state detection device according to claim 1, wherein the calculating unit calculates the second state of charge by performing correction based on a temperature of the secondary battery with respect to a predetermined function including the ratio of the reaction resistance obtained by subtracting the conductive resistance and the liquid resistance from the internal resistance obtained by the measuring unit and the sum of the reaction resistance values obtained by the learning unit.

3. The secondary battery state detection device according to claim 1, wherein the calculating unit calculates the second state of charge by performing correction based, wherein the measuring unit subtracts an open-circuit voltage, a stratification voltage, and a polarization voltage from the other voltage, divides an overvoltage value obtained in the subtraction by the other current value, and determines a value obtained in the division as the resistance value of the secondary battery.

4. The secondary battery state detection device according to claim 1, wherein the correction unit executes a correction processing for the correlation equation of the determination unit, in a case of an initial processing after the secondary battery is mounted in the vehicle, in a case where a charge current is less than one in a previous processing, or in a case where a period longer than a predetermined one has elapsed from the previous processing.

5. The secondary battery state detection device according to claim 1, wherein the correlation equation is a linear function, and wherein the correction unit corrects a linear intercept of the linear function.

6. A method of detecting a state of charge of a secondary battery installed in a vehicle, comprising the steps of:
measuring or estimating an open-circuit voltage of the secondary battery installed in the vehicle;
determining a first state of charge of the secondary battery by applying the open-circuit voltage to be measured or estimated to a correlation equation expressing a relationship between open-circuit voltages and states of charge;
learning an element value of an equivalent circuit of the secondary battery based on a voltage and a current obtained during a discharging of the secondary battery;
measuring an internal resistance value of the secondary battery based on another voltage and another current during a charging of the secondary battery;
calculating a second state of charge of the secondary battery based on a ratio of a reaction resistance obtained by subtracting a conductive resistance and a liquid resistance from the internal resistance and a sum of reaction resistance values obtained during the learning;
correcting a coefficient of the correlation equation to generate a modified correlation equation if a difference between the values of the first state of charge and the second state of charge is greater than or equal to a predetermined threshold value; and
determining a corrected state of charge of the secondary battery based on the modified correlation equation.

7. The method of claim 6, wherein the calculating the second state of charge comprises performing correction based on a temperature of the secondary battery with respect to a predetermined function including the ratio of the reaction resistance obtained by subtracting the conductive resistance and the liquid resistance from the internal resistance and the sum of the reaction resistance values.

8. The method of claim 6, wherein the calculating unit the second state of charge comprises performing correction based subtracting an open-circuit voltage, a stratification voltage, and a polarization voltage from the other voltage, dividing an overvoltage value obtained in the subtraction by the other current value, and determining a value obtained in the division as the resistance value of the secondary battery.

9. The method of claim 6, wherein the correcting comprises a correction processing for the correlation equation, in a case of an initial processing after the secondary battery is mounted in the vehicle, in a case where a charge current is less than one in a previous processing, or in a case where a period longer than a predetermined one has elapsed from the previous processing.

10. The method of claim 6, wherein the correlation equation is a linear function, and wherein the correction unit corrects a linear intercept of the linear function.

11. A non-transitory computer-readable medium having instructions stored thereon for detecting a state of charge of a secondary battery installed in a vehicle that, in response to execution, cause a system including a processor to perform operations comprising:
measuring or estimating an open-circuit voltage of the secondary battery installed in the vehicle;
determining a first state of charge of the secondary battery by applying the open-circuit voltage to be measured or estimated to a correlation equation expressing a relationship between open-circuit voltages and states of charge;
learning an element value of an equivalent circuit of the secondary battery based on a voltage and a current obtained during a discharging of the secondary battery;
measuring an internal resistance value of the secondary battery based on another voltage and another current during a charging of the secondary battery;
calculating a second state of charge of the secondary battery based on a ratio of a reaction resistance obtained by subtracting a conductive resistance and a liquid resistance from the internal resistance and a sum of reaction resistance values obtained during the learning;
correcting a coefficient of the correlation equation to generate a modified correlation equation if a difference between the values of the first state of charge and the second state of charge is greater than or equal to a predetermined threshold value; and
determining a corrected state of charge of the secondary battery based on the modified correlation equation.

12. The non-transitory computer-readable medium of claim 11, wherein the calculating the second state of charge comprises performing correction based on a temperature of the secondary battery with respect to a predetermined function including the ratio of the reaction resistance obtained by subtracting the conductive resistance and the liquid resistance from the internal resistance and the sum of the reaction resistance values.

13. The non-transitory computer-readable medium of claim 11, wherein the calculating unit the second state of charge comprises performing correction based subtracting an open-circuit voltage, a stratification voltage, and a polarization voltage from the other voltage, dividing an overvoltage value obtained in the subtraction by the other current value, and determining a value obtained in the division as the resistance value of the secondary battery.

14. The non-transitory computer-readable medium of claim 11, wherein the correcting comprises a correction processing for the correlation equation, in a case of an initial processing after the secondary battery is mounted in the vehicle, in a case where a charge current is less than one in a previous processing, or in a case where a period longer than a predetermined one has elapsed from the previous processing.

15. The non-transitory computer-readable medium of claim 11, wherein the correlation equation is a linear function, and wherein the correction unit corrects a linear intercept of the linear function.

* * * * *